United States Patent [19]
Kondo

[11] 4,218,774
[45] Aug. 19, 1980

[54] AUTOMATIC GAIN CONTROL CIRCUIT

[75] Inventor: Minoru Kondo, Tokyo, Japan

[73] Assignee: Pioneer Electronic Corporation, Tokyo, Japan

[21] Appl. No.: 965,135

[22] Filed: Nov. 30, 1978

[30] Foreign Application Priority Data
  Dec. 1, 1977 [JP] Japan .................... 52-144510

[51] Int. Cl.³ .............................. H04B 1/18
[52] U.S. Cl. .................... 455/249; 455/250; 455/253; 455/289; 455/292
[58] Field of Search ............ 325/319, 366, 372, 376, 325/383, 385, 387, 400, 408, 441, 412–415, 362, 371, 381; 330/284, 282

[56] References Cited
U.S. PATENT DOCUMENTS

| | | | |
|---|---|---|---|
| 3,259,846 | 7/1966 | Elliott et al. | 325/415 |
| 3,581,210 | 5/1971 | Amfahr | 325/411 |
| 3,600,684 | 8/1971 | Cherry | 325/319 |
| 4,158,814 | 6/1979 | Imazeki et al. | 325/413 |

Primary Examiner—Jin F. Ng
Attorney, Agent, or Firm—Sughrue, Rothwell, Mion, Zinn and Macpeak

[57] ABSTRACT

An automatic gain control circuit for an AM receiver uses a signal having the same wavelength but reversed in phase with the signal in the antenna circuit. A variable resistance attenuator element such as a biased FET or PIN diode is used in the external antenna circuit having a winding to selectively attenuate the input signal to the tuning circuit including a secondary winding. Gain control is performed in an analog manner with respect to the input signal of the external circuit.

5 Claims, 3 Drawing Figures

AUTOMATIC GAIN CONTROL CIRCUIT

BACKGROUND OF THE INVENTION

This invention relates to an automatic gain control circuit adapted to be utilized in an AM receiver, in which a variable capacitance diode (hereinafter referred to as "varicap diode") is employed.

Generally, an AM receiver has a ferrite bar antenna for effectuating the signal feeding operation when radio waves are received without an external antenna. A winding for the external antenna is utilized in the case of weak electric fields. The bar antenna has a primary winding for the external antenna which is low in impedance, a secondary tuning winding and a tertiary winding for injection into an IC or an amplifier. The number of turns of the primary and the tertiary windings are approximately equal. The number of turns of the secondary tuning winding is approximately ten times as many as that of the primary or the tertiary winding. Accordingly, the radio wave fed from the external antenna is induced in the secondary tuning winding as a high frequency signal stepped up about ten times.

In the case where a varicap diode is employed in the tuning circuit of the AM receiver as a capacitance element and the receiver circuit is tuned by the varicap, the secondary tuning winding, etc., a problem is encountered. Since the input signal fed from the external antenna is stepped up about ten times and then applied to the tuning circuit, the reversely biased varicap diode acting as a capacitance element is biased in the forward direction, thereby losing its ability to function as a capacitance element when a large input signal is fed from the external antenna. As a result, phenomena such as detuning and oscillation occur so that tuning performance significantly deteriorates.

Conventionally, in order to prevent this problem, a change-over switch switchable between near distance or far distance is provided in the external antenna circuit. Alternatively, an RF amplifier, including an FET, is connected in the external antenna circuit, with the FET gate connected to the tertiary winding to automatically control the gain of the external antenna. It is difficult, however, to automate the switching operation of the change-over switch, and it is necessary to perform the switching operation every time a strong electric field or a weak electric field is received. Furthermore, in an electronic type attenuator employing an FET amplifier, a large amount of attenuation cannot be obtained and it is difficult to prevent the characteristic deterioration caused by a large input.

SUMMARY OF THE INVENTION

In view of the above described circumstance, an object of the present invention is to provide an improved automatic gain control circuit which performs gain control automatically.

It is another object of this invention to provide an automatic gain control circuit that sufficiently attenuates the input signal of the tuning circuit.

In order to achieve these objects, a signal having the same wavelength and reversed phase as the signal of an antenna circuit is applied to the antenna circuit, whereupon the gain control is performed by attenuating the input level of the tuning circuit. This invention will be described in detail with respect to the accompanying drawings and the description of the preferred embodiment that follows.

BRIEF DESCRIPTION OF THE DRAWINGS

In the accompanying drawings.

DESCRIPTION OF THE PREFERRED EMBODIMENT

One embodiment of the present invention will now be described with reference to the accompanying drawings.

Figure 1:
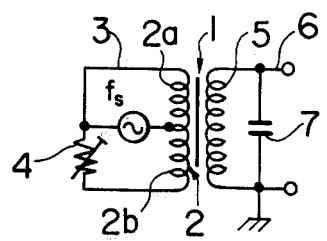
FIG. 1 is a circuit diagram showing the principle of the present invention.
Figure 2:
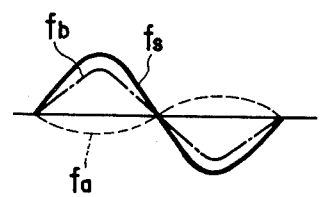
FIG. 2 is a diagram showing signal waveforms to explain an attenuation condition.

Referring to FIGS. 1 and 2, the principle of the present invention will first be described. An antenna circuit 3 includes a primary winding 2 of a bar antenna 1 and an input signal $f_s$ is supplied to a midpoint the primary winding 2 from an external antenna and a variable resistor 4 is provided only in one side loop of the antenna circuit 3. A tuning circuit 6 includes a secondary winding 5 of the bar antenna 1 and a tuning capacitor 7. In the case where the resistance of the variable resistor 4 is zero, the input signal $f_s$ flows through both the half parts 2a and 2b of the primary winding 2 with the same amplitude but in opposite or reversed phase (i.e., signal $f_s$ flows through parts 2a and 2b in opposite direction), so that the effect of input signal applied thereto is cancelled in that the net magnetic field generated by the primary winding is zero.

As a result, no signal is transmitted to the secondary winding 5. If the variable resistor 4 is set to have a certain resistance, the input signal $f_s$ flows through the half part 2a of the primary winding 2, whereas a signal whose amplitude is decreased due to the variable resistor 4 flows through the half part 2b of the primary winding 2. Thus, if there is applied to part 2b a signal $f_a$, as shown in FIG. 2, having a wavelength equal to the input signal $f_s$, but reversed in phase with respect to the input signal $f_s$, and having a level or amplitude is small with respect to $f_s$, than a signal $f_b$, corresponding to subtracted signal i.e., $f_s - f_a$, is generated as the output from the primary winding 2, and that signal is transmitted to the secondary winding 5. In this manner, the input signal level of the tuning circuit 6 is attenuated in correspondence to the resistance of the variable resistor 4. The amount of attenuation is theoretically infinity.

Figure 3:
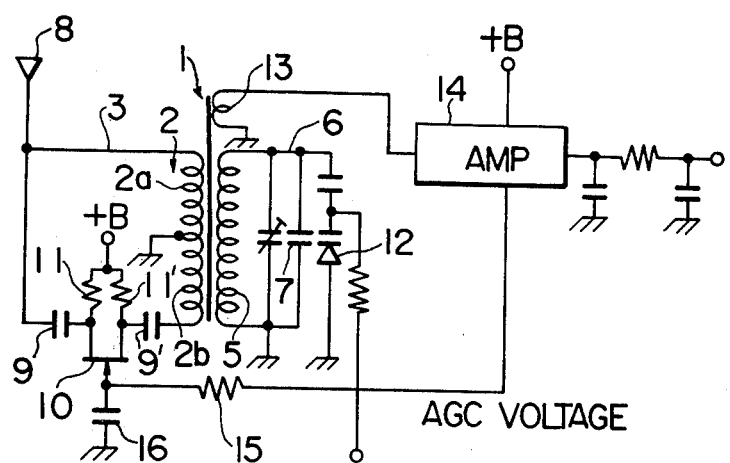
FIG. 3 is a circuit diagram of an automatic gain control circuit according to the preferred embodiment of the present invention.

The present invention performs gain control in accordance with the above described principle. One preferred embodiment of an automatic gain control circuit according to the present invention will now be described with reference to FIG. 3.

An external antenna 8 is coupled to a primary winding 2 of an antenna circuit 3, and the midpoint of the primary winding 2 is grounded. At side 2b of the primary winding 2, the source and the drain of a N type channel field effect transistor (FET) 10 are coupled through a coupling capacitor 9 and are coupled to a battery source through bias resistors 11 and 11'. In a tuning circuit 6 at the side of a secondary winding 2 of the bar antenna 1, a capacitor 7 and a varicap diode 12 are connected in parallel to the secondary winding 5. The varicap diode 12 is reversely biased and operates as a capacitance element similar to the capacitor 7 due to the connection of its cathode to the source battery. A tertiary winding 13 of the bar antenna 1 is connected to an AM amplifying circuit 14 from which a control signal corresponding to an AGC voltage is applied to the gate of the FET 10 through a protection resistor 15 and a by-pass capacitor 16.

When the input signal fed from the external antenna 8 is small, the AGC operation of the AM amplifying circuit is not effected, and a constant bias voltage, lower than the source battery voltage between the source and the drain of the FET 10, is applied to the gate of the FET 10. As a result, the FET is reverse biased to thereby provide a high resistance. Hence, the input signal of the external antenna 8 is transmitted from the primary winding 2 to the secondary winding 5 and tertiary winding 13 with little attenuation to the input signal.

If the input signal of the external antenna 8 is large, the voltage at the gate of the FET 10 is controlled to become higher due to the AGC operation in the AM amplifying circuit 14. When gate voltage of the FET 10 becomes equal to or higher than the voltage between the source and the drain of the FET 10, then the FET 10 becomes conductive showing low resistance, and the signal level in part 2b of the primary winding 2 increases to cause the signal level in the antenna circuit to be attenuated. As a result, the input signal level $f_b$ of the tuning circuit is suppressed or attenuated so as not to become too large, and thus gain control is performed. The FET 10 is utilized as a resistance attenuator in which the resistance is changed in accordance with the voltage applied to the gate of the FET 10. Accordingly, gain control is performed attenuating in an analog fashion with respect to the input signal of the external antenna.

As described, according to the present invention, control is effectuated so that a signal of large amplitude is not delivered as an input to the tuning circuit 6. Therefore, the basic problem that the varicap diode 12 loses its role as a capacitance element due to the forward biasing is eliminated. Since elements of the automatic gain control system are not provided in the circuit according to the present invention, influences, such as distortion ratio due to non-linearity, hindrance due to mixture demodulation and the like are not caused.

It is also possible to employ an attenuator such as a PIN diode instead of the FET 10. In this case, it is possible to obtain a controlling range more than the attenuating amount of the PIN diode. Furthermore, the AGC operation can be performed to the portions where the nonlinearlity of the semiconductors is varied and where the hindrances of mixture demodulation or mutual demodulation are deteriorated, if the AGC operation is performed according to conventional technique.

It is apparent that other modifications of this invention are possible without departing from the essential scope thereof.

What is claimed is:

1. In a radio receiver of the type including a bar antenna having a primary winding connected to an external antenna, a secondary winding connected to a tuning circuit, and a tertiary winding connected to an amplifier circuit, an improved automatic gain control circuit for protecting the tuning circuit from a large amplitude input radio signal received by said external antenna, said automatic gain control circuit comprising:
   variable impedance means in said primary winding; and
   feedback means coupled between said primary winding and the output of said amplifier circuit for feeding back to said variable impedance means an automatic gain control signal of the same wave length as said input signal to vary said impedance means such that a large amplitude input signal is attenuated more than a smaller amplitude input signal.

2. The automatic gain control circuit of claim 1 wherein said primary winding is a center-tapped winding, said external antenna is connected across both sides of said primary winding, and said variable impedance means is connected in series with only one side of said primary winding.

3. The automatic gain control circuit of claims 1 or 2 wherein said impedance means comprises an FET connected in series with said one side of said primary winding, the gate of said FET being biased by said automatic gain control signal.

4. The automatic gain control circuit of claim 3 further comprising means normally biasing said FET to a nonconductive, high impedance state so that a relatively low input signal is not attenuated, said feedback means being responsive to a relatively high input signal to produce a correspondingly relatively high automatic gain control signal to bias said FET to a relatively conducting, low impedance state, thereby attenuating said relatively high input signal.

5. The automatic gain control circuit of claim 3 further comprising a tuning capacitor and a variable capacitance diode respectively connected in parallel to said secondary winding.

* * * * *